United States Patent [19]

Vorenkamp et al.

[11] Patent Number: 5,751,236

[45] Date of Patent: May 12, 1998

[54] A/D CONVERSION WITH FOLDING AND INTERPOLATION

[75] Inventors: Pieter Vorenkamp; Arnoldus G.W. Venes; Rudy J. Van De Plassche, all of Eindhoven, Netherlands

[73] Assignee: U.S. Philips Corporation, New York, N.Y.

[21] Appl. No.: 709,401

[22] Filed: Sep. 4, 1996

[30] Foreign Application Priority Data

Sep. 8, 1995 [EP] European Pat. Off. ............ 95202444
Jul. 16, 1996 [EP] European Pat. Off. ............ 96202014

[51] Int. Cl.$^6$ ................................................. H03M 1/00
[52] U.S. Cl. ................................. 341/155; 341/156
[58] Field of Search .............................. 341/155, 153, 341/156, 133

[56] References Cited

U.S. PATENT DOCUMENTS

| | | | |
|---|---|---|---|
| 4,831,379 | 5/1989 | van de Plassche | 341/156 |
| 5,126,742 | 6/1992 | Schmidt et al. | 341/156 |
| 5,633,638 | 5/1997 | Venes et al. | 341/155 |
| 5,640,163 | 6/1997 | Navta et al. | 341/155 |

OTHER PUBLICATIONS

Van de Plassche et al "An 3 Bit 100MHZ Full Nyquist A/D Converter" Dec. 1988, pp. 1334–1344, IEEE Journal vol. SC–23 No. 6.

Van de Grift et al "An 8–bit Video ADC . . . Folding & Interpolation Techiques", Dec. 1987, pp. 944–953. IEEE Journal vol. 22 #6.

Primary Examiner—Jeffrey A. Gaffin
Assistant Examiner—Peguy JeanPierre
Attorney, Agent, or Firm—Leroy Eason

[57] ABSTRACT

An A/D converter has an input part IS which provides differential transitions $T_1 \ldots T_x$ associated with different levels of an analog input signal. An intermediate part IMS of the converter carries out folding operations and interpolation operations on the transitions to thereby obtain a set of bit-determining signals $X_O \ldots X_Q$. At least one of the folding and interpolation operations is carried out more than once in alternation with the other of such operations. An output part OS produces a digital output signal from the bit-determining signals. Such an A/D converter can be implemented in a cost-efficient manner and may be combined with digital signal processing circuitry. The repetition of at least one of the operations alternately with the other permits the interpolation factor to be increased without necessitating increased complexity of the output part, and the folding factor to be increased without adversely affecting the accuracy of the converter.

6 Claims, 13 Drawing Sheets

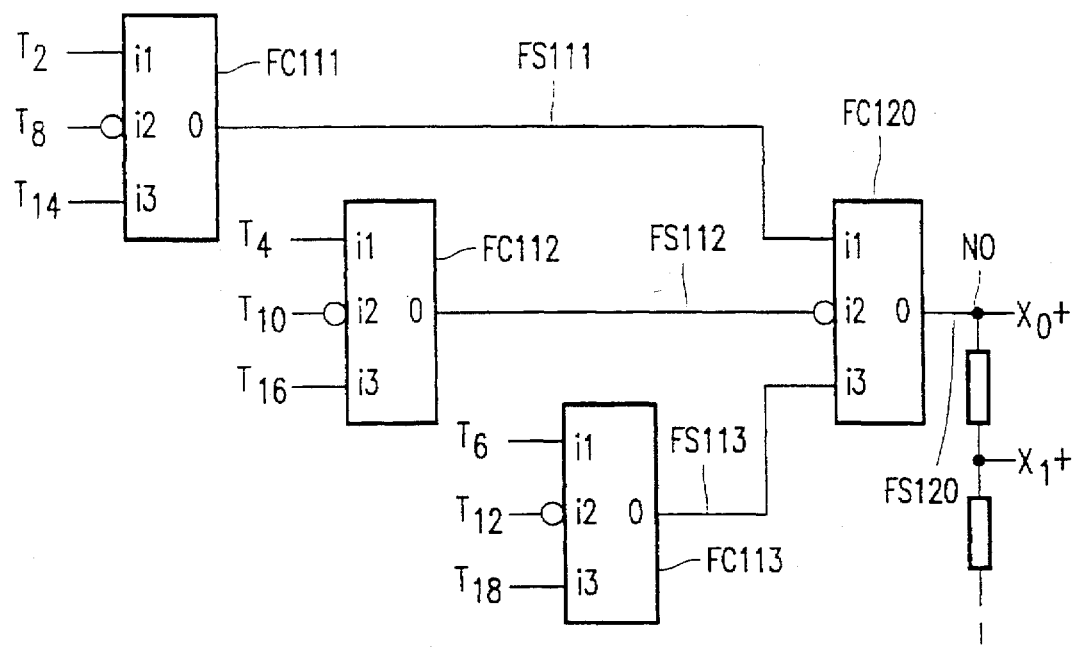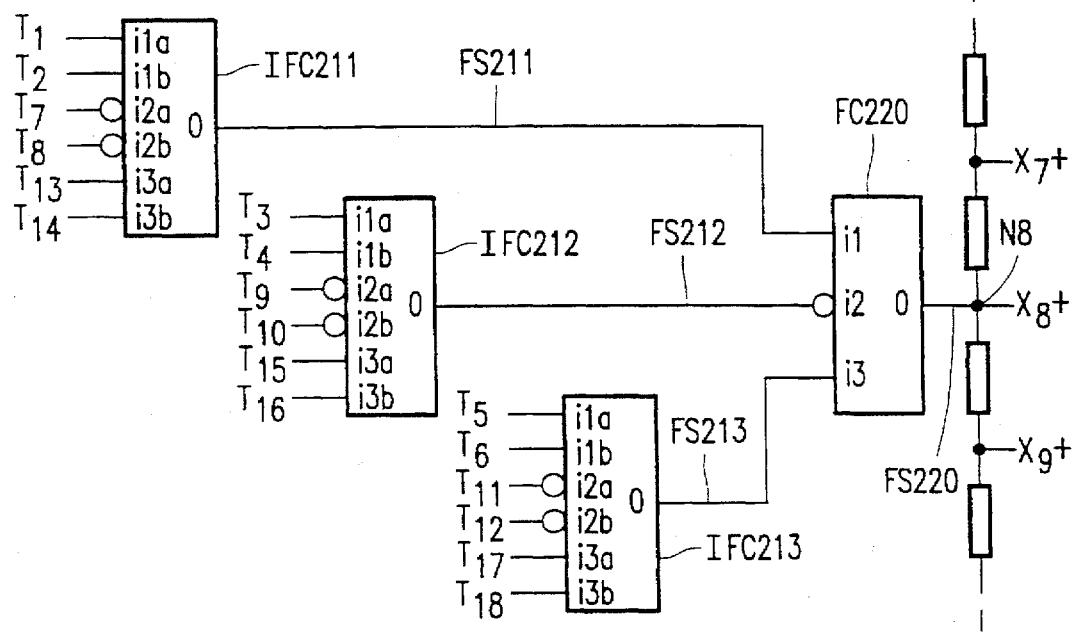
FIG. 4a-1
FIG. 4a-2
FIG. 4a
FIG. 4a-1

A/D CONVERSION WITH FOLDING AND INTERPOLATION

BACKGROUND OF THE INVENTION

1. Field of the Invention

The invention relates to an A/D conversion circuit and method in which folding and interpolation operations are carried out. The invention also relates to a signal processor incorporating such an A/D conversion circuit.

2. Description of the Related Art

U.S. Pat. No. 4,831,379 issued May 16, 1989, assigned to present assignee, describes an 8-bit prior-art A/D converter of the above-identified type. Such A/D converter, shown in FIG. 3 of said U.S. Pat. No. 4,381,379, comprises the following parts: an input amplifier array, a folding array, an interpolation circuit, a group of fine comparators and a group of coarse comparators, and an encoder.

The input amplifier array comprises 64 input amplifiers. Assuming that i is an integer ranging from 0 to 63, each amplifier Ai amplifies the difference between an analog input voltage and a corresponding reference voltage VRi to produce an amplified output voltage VAi.

The folding array electrically combines groups of amplified output voltages VA0–VA63 to produce 16 VB signals VB0–VB7 and VBN0–VBN7. The VB signals make repetitive transitions between their extreme levels as the analog input voltage varies across the input range extending from VR0 to VR63. The latter is illustrated in FIG. 7 of said U.S. Pat. No. 4,831,379. The interpolation circuit interpolates by a factor of 4 between each consecutive pair of VB signals to generate 64 interpolated signals VD0–VD31 and VDN0–VDN31.

The fine comparator group consists of 32 master-slave flip-flops. Each master-slave flip-flop Cq compares complementary signals VDq and VDNq to generate a digital bit Dq. Accordingly, 32 bits D0–D31 are obtained which the encoder encodes into five least significant bits MSB-3–MSB-7 of a digital output code. The coarse comparator group consists of three master-slave flip-flops which respectively provide the three most significant bits MSB–MSB-2 of the digital output code in response to three respective pairs of complementary further signals obtained in largely the same manner as the VB signals.

SUMMARY OF THE INVENTION

The invention seeks to provide an A/D a circuit and method which, with respect to the prior-art, allows more cost-efficient implementations which have comparable accuracy.

The invention takes the following aspects into consideration. In principle, the complexity of the input part of an A/D converter of the prior-art type may be reduced by increasing the interpolation factor. For example, if the interpolation factor in the prior-art A/D converter circuit had been 8 instead of 4, only 32 instead of 64 input stages would have been required. However, in that case 64 instead of 32 pairs of interpolated signals would have had to be obtained and, consequently, 64 instead of 32 fine comparators would have been needed. Thus, in the prior-art converter, the choice of the interpolation factor entails a compromise between the complexity of the input part and that of the output part.

In principle, the complexity of the output part of an A/D converter of the prior-art type may be reduced by increasing the folding factor, that is, the number of transitions provided by the input part which are combined to one signal. For example, if the folding factor in the prior-art A/D converter had been 16 instead of 8, only 4 instead of 8 pairs of complementary signals would have been applied to the interpolation circuit. In that case, only 16 instead of 32 of interpolated signals would have been obtained and, consequently, only 16 instead of 32 fine comparators would have been sufficient. However, if the number of signal pairs applied to the interpolation circuit had been reduced to 4, the interpolated signals and, consequently, the A/D conversion would have been less accurate. Thus, in the prior-art converter, the choice of the folding factor entails a compromise between the complexity of the output part and the performance of the A/D converter. In any case, at least two signal pairs are needed for an interpolation, which means that the folding factor in the prior-art A/D converter cannot exceed 32.

In accordance with the invention, at least one of the operations, folding or interpolation, is carried out more than once in alternation with the other operation, interpolation or folding, respectively. For such an A/D conversion, the compromises described above and associated with the prior-art A/D converter no longer apply. For example, in accordance with the invention, a first interpolation operation may be carried out, followed by a folding operation which is further followed by a second interpolation operation. If in that case, the interpolation factor of the first interpolation is increased by a factor of 2, the overall interpolation factor will be increased by a factor of 2 and, consequently, only half the number of input stages will be required. If, furthermore, the folding factor of the folding operation is also increased by a factor of 2, the number of interpolated signals as a result of the second interpolation operation will remain the same and, consequently, no additional output circuitry will be required. Thus, in contrast to the prior-art A/D converter, the input part may be simplified by increasing the interpolation factor, without this automatically requiring a more complex output part.

Another example in accordance with the invention is a first folding operation followed by an interpolation operation, further followed by a second folding operation. If in that case, the folding factor of the second folding operation is increased by a factor of 2, the overall folding factor will be increased by a factor of 2 and, consequently, only half the number of signals will be supplied to the output part which, as a consequence, may have a simpler construction. The interpolation accuracy will not be affected, because the folding factor of the first folding operation remains the same and, consequently, the number of signals on which the interpolation is carried out remains the same. Thus, in contrast to the prior-art converter, the output part may be simplified by increasing the folding factor without this substantially affecting the accuracy.

The invention thus permits simplification of the input part as well as the output part of an A/D converter, thereby achieving cost-efficiency, without adversely affecting accuracy. Besides, the power consumption of the A/D converter is also diminished thereby, which makes it particularly suitable for use in portable devices such as camcorders, cellular telephones and other devices. Furthermore, since the input part requires relatively few transistors, the transistors may be relatively large, which is beneficial to the accuracy of the A/D converter. Accordingly, a relatively accurate A/D converter may be built up with MOS transistors only. This allows the A/D converter to be integrated in a digital signal processor which is commonly implemented with MOS transistors.

BRIEF DESCRIPTION OF THE DRAWINGS

The invention and its additional features, which may optionally be used to implement the invention to best advantage, will be apparent from and elucidated with reference to the embodiments described hereafter with reference to the accompanying drawings, wherein.

Identical elements have the same reference signs throughout the drawings.

DESCRIPTION OF THE PREFERRED EMBODIMENTS

FIGS. 1a to 1d show four basic examples of A/D converters in accordance with the invention. The four basic examples have the following in common. An input part IS provides transitions T1 . . . TX associated with different levels of an analog input signal Vi. An intermediate part IMS carries out folding F and interpolation I operations on the transitions T1 . . . TX to obtain a set of bit-determining signals X0 . . . XQ. At least one of the operations, folding F or interpolation I, is carried out more than once in alternation with the other operation, interpolation I or folding F, respectively. An output part OS provides a digital output signal Do on the basis of the bit-determining signals X0 . . . XQ.

Figure 1A:
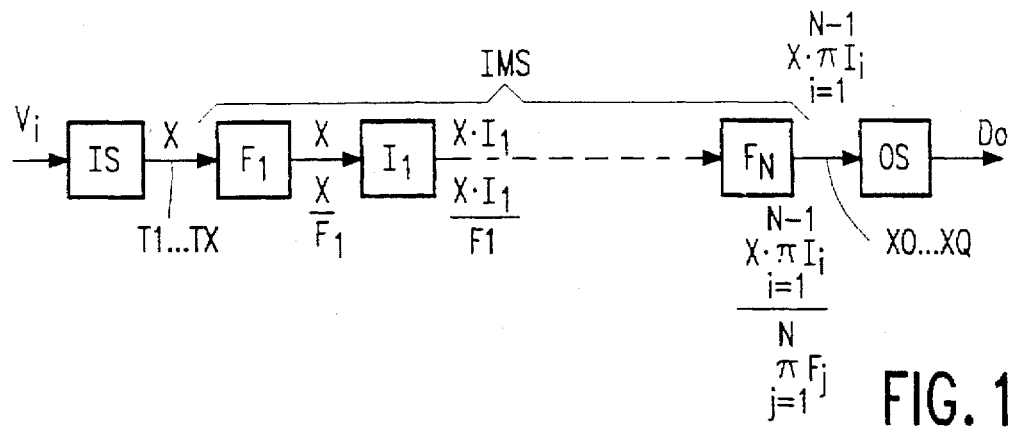
FIGS. 1a to 1d show, in a block diagram form, four basic examples of an A/D converter in accordance with the invention.
Figure 1B:
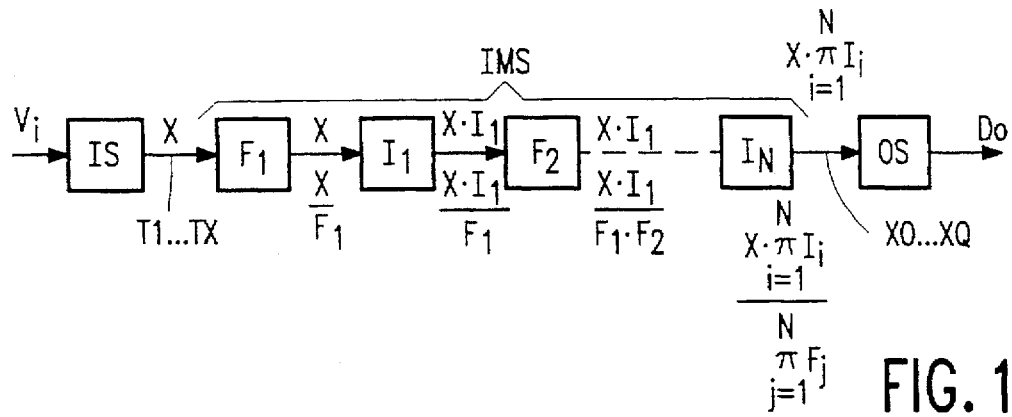
Figure 1C:
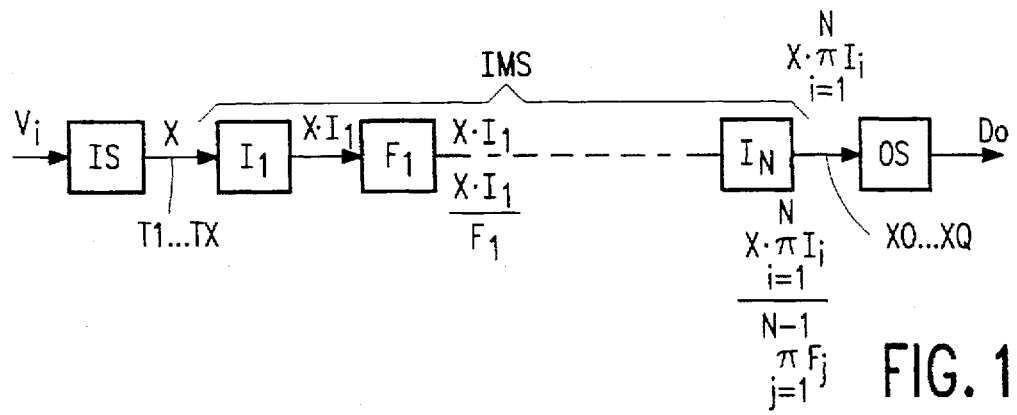
Figure 1D:
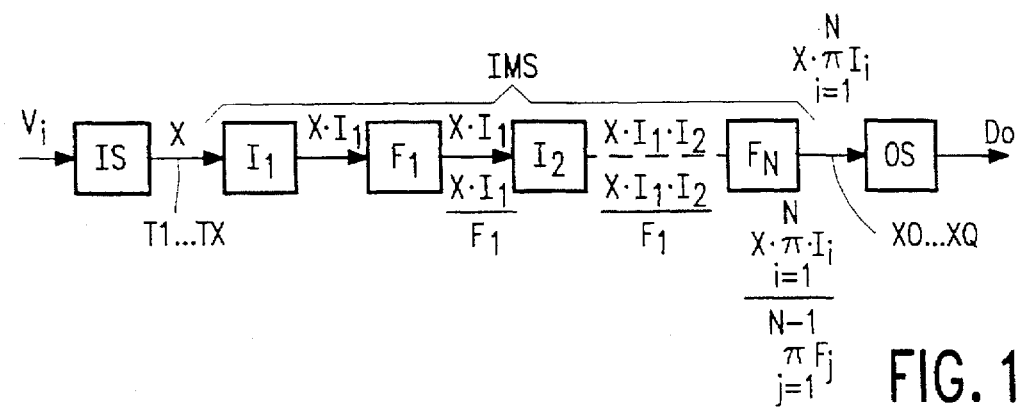

The differences between the four basic examples shown in FIGS. 1a to 1d lie within the intermediate part IMS. In FIGS. 1a and 1b, a folding operation F1 is carried out first and, subsequently, an interpolation operation I1 is carried out. In FIG. 1a, a folding operation FN provides the set of bit-determining signals X0 . . . XQ, whereas in FIG. 1b, an interpolation operation IN provides the set of bit-determining signals X0 . . . XQ. In FIGS. 1c and 1d, an interpolation operation I1 is carried out first and, subsequently, a folding operation F1 is carried out. In FIG. 1c, an interpolation operation IN provides the set of bit-determining signals X0 . . . XQ, whereas in FIG. 1d, a folding operation FN provides the set of bit-determining signals X0 . . . XQ.

In each of the basic examples shown in FIGS. 1a to 1d, there may or may not be additional folding and interpolation operations which are not visualized as such in these FIG. For example, in an A/D converter according to FIG. 1b two folding operations and two interpolation operations may be carried out. In that case, N=2, that is, the last interpolation operation is I2 which is carried out subsequent to the folding operation F1. As another example, in an A/D converter according to the FIG. 1b three folding operations and three interpolation operations may be carried out. In that case, N=3, that is, the last interpolation operation is I3 and a folding operation F3, not shown in FIG. 1b, is carried out after a second interpolation operation I2.

In FIGS. 1a to 1d, the reference signs which are located directly above a line connecting two functional blocks denote the maximum number of transitions which the left-hand block may apply to the right-hand block. The reference signs which are located directly below a line connecting two functional blocks denote the maximum number of folding signals which the left-hand block may apply to the right-hand block. The functional blocks denoted by F and I carry out folding and interpolation operations, respectively. An interpolation operation I increases both the number of transitions and the number of folding signals by its interpolation factor. The first folding operation F1 provides a number of folding signals which is equal to the number of transitions supplied thereto, divided by the folding factor of the first folding stage. Subsequent folding operations, if any, reduce the number of folding signals by their respective folding factors but do not change the number of transitions. Folding factors and interpolation factors are denoted by the same reference signs which are used to denote the respective operations.

Figure 1E:
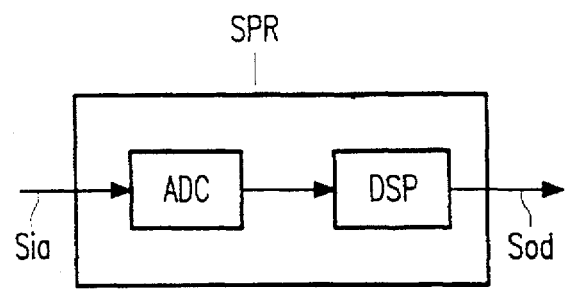
FIG. 1e shows, in a block diagram form, a basic example of a signal processor in accordance with the invention.

FIG. 1e shows a basic example of a signal processor in accordance with the invention. In the FIG. 1e signal processor, an A/D converter ADC in accordance with the invention, converts the analog input signal Sia into a digital signal which is processed by a digital signal processor DSP to provide a digitally processed output signal Sod. The FIG. 1e signal processor may be, for example, an integrated circuit or a receiver.

Figure 2:
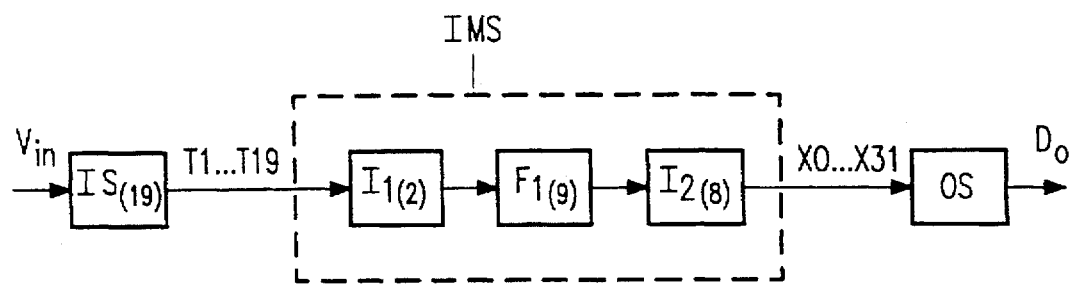
FIG. 2 shows, in a block diagram form, a first specific example of an A/D converter in accordance with the invention.

FIG. 2 shows a first specific example of an 8-bit A/D converter according to the invention. The input part IS of the FIG. 2 A/D converter provides 19 transitions T1 . . . T19 in response to the analog input signal Vi. The intermediate part IMS of the FIG. 2 A/D converter consecutively carries out a first interpolation operation I1 by a factor of 2, a folding operation F1 by a factor of 9, and a second interpolation operation by a factor of 8.

Accordingly, 32 bit-determining signals X0–X31 are obtained from which the output part OS derives 5 least significant bits for the 8-bit digital output signal Do. In addition, the FIG. 2 A/D converter comprises circuitry, not shown in FIG. 2, to derive 3 most significant bits.

This circuitry may be similar to, for example, the circuitry used in the above cited U.S. Pat. No. 4,831,379 for the same purpose.

Figure 3A:
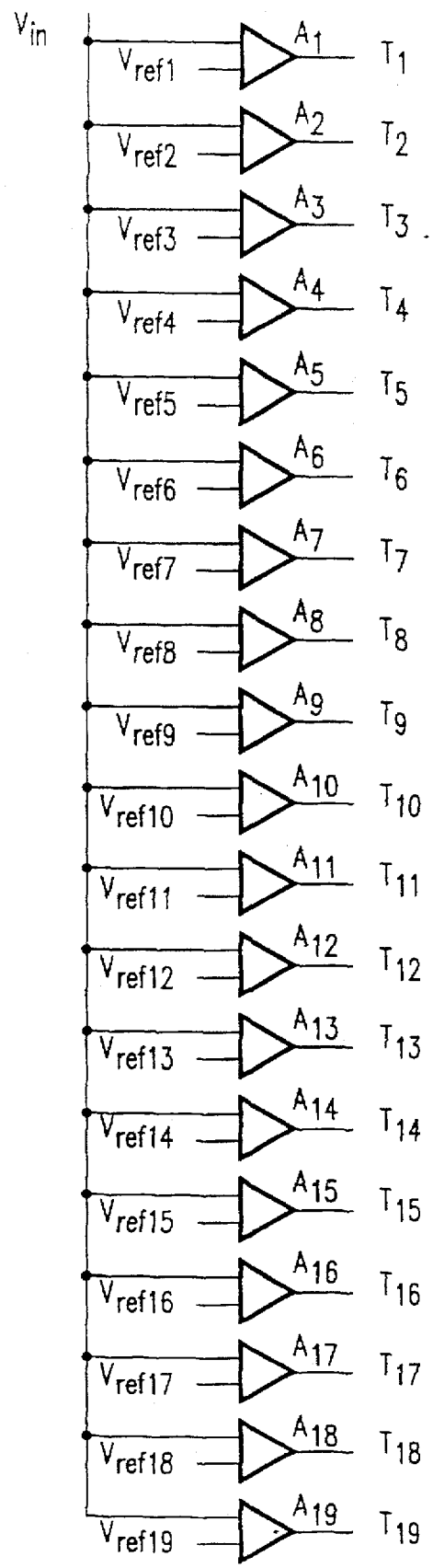
FIG. 3a shows, in a block diagram form, an implementation example of the input part in the FIG. 2 A/D converter.

FIG. 3a shows an implementation example of the input part IS in the FIG. 2 A/D converter. The FIG. 3a input part comprises an array of 19 input amplifiers A1 . . . A19.

Figure 3B:
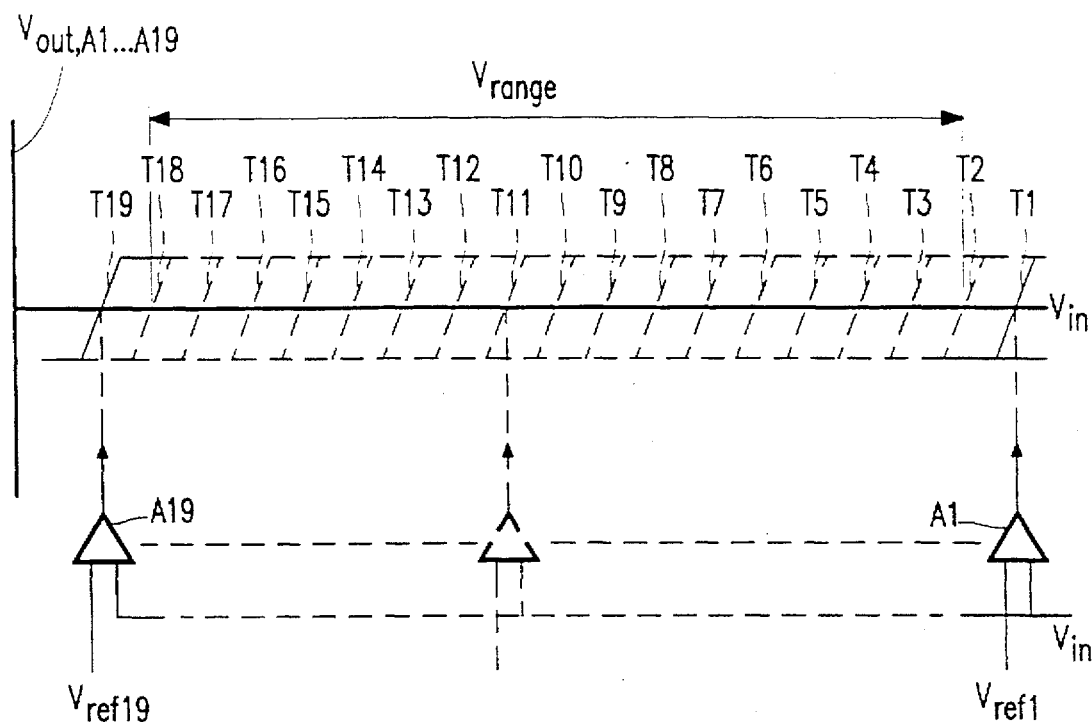
FIG. 3b shows transitions provided by the FIG. 3a input part.
Figure 3C:
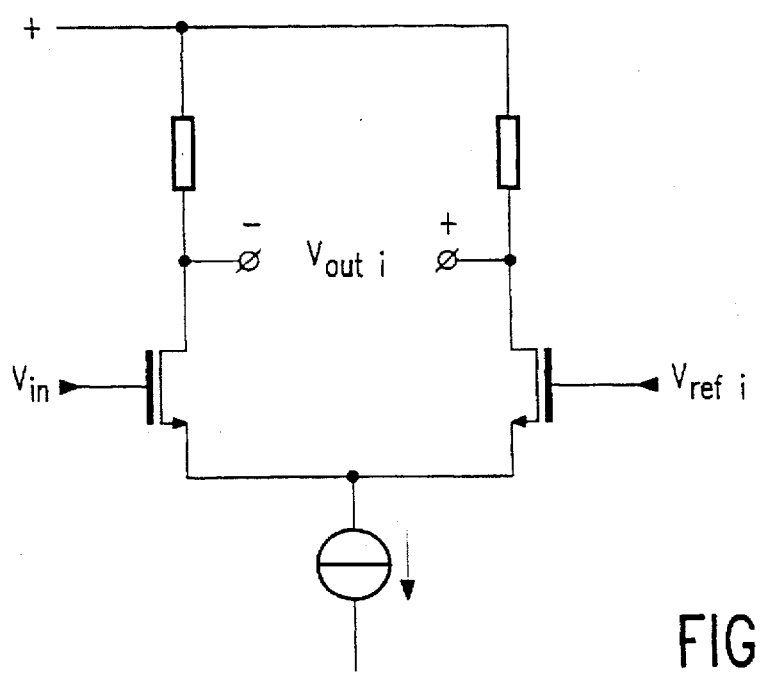
FIG. 3c shows, in a circuit diagram form, an implementation example of an input amplifier in the FIG. 3a input part.

Assuming that the value of the analog input signal $V_{in}$ is an integer ranging from 0 to 19, each amplifier Ai amplifies the difference between the input signal Vin and a reference voltage Vrefi to produce a transition Ti. The more the input signal Vin is amplified, the less any offsets in the intermediate part IMS affect the accuracy pf the A/D converter. FIG. 3b depicts the relation between the input signal Vin and the transitions T1 ... T19. The input signal range is denoted by Vrange. FIG. 3c shows details of the input amplifiers. An input amplifier Ai is basically a differential pair which provides a differential output signal Vouti in response to the difference between the input signal Vin and the reference voltage Vrefi.

Figures 1, 2, 4A:
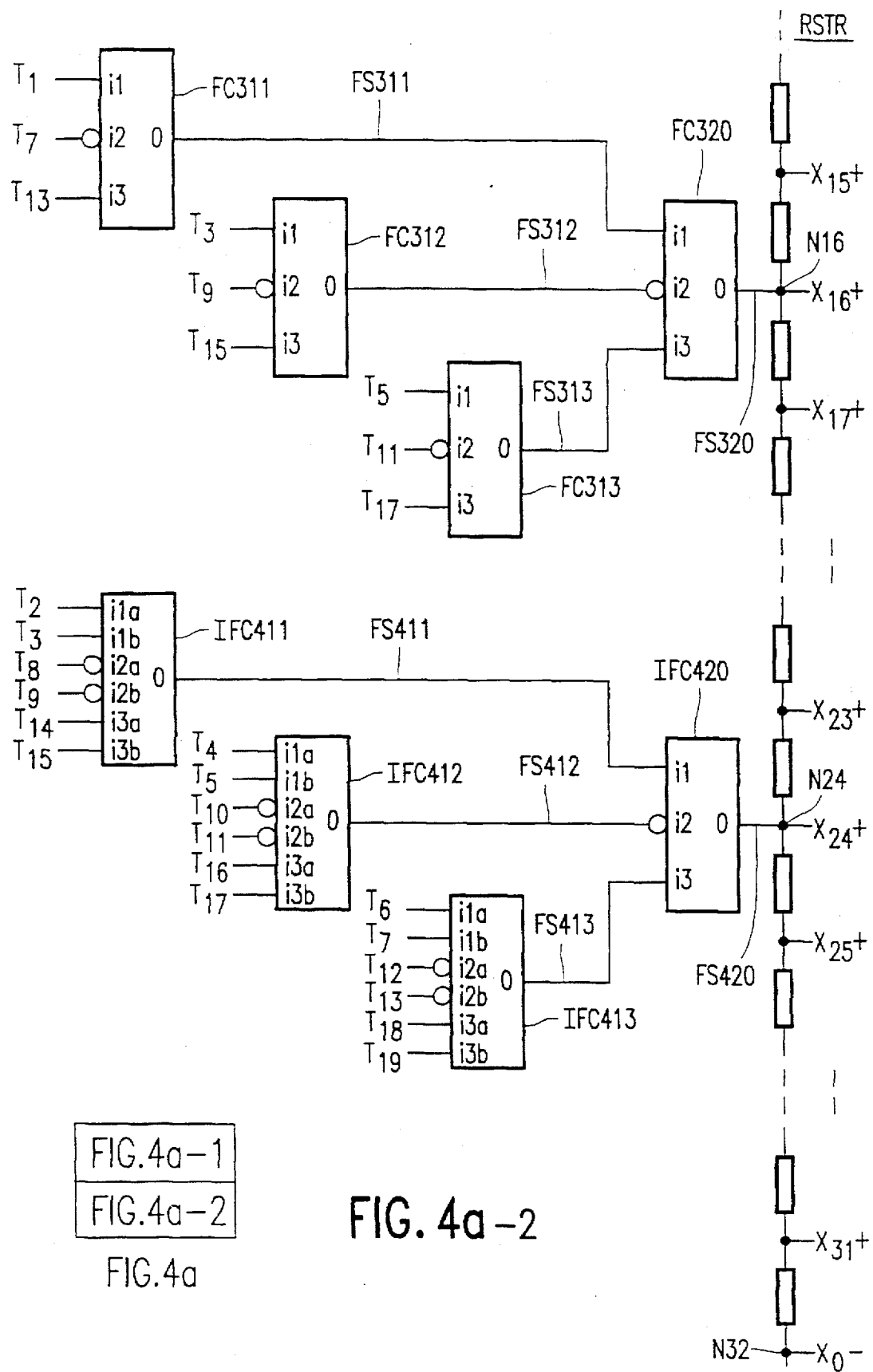
FIG. 4a shows, in a block diagram form, an implementation example of the intermediate part in the FIG. 2 A/D converter.

FIG. 4a shows an implementation example of the intermediate stage IMS in the FIG. 2 A/D converter. The FIG. 4a intermediate part IMS has largely been build up in a modular manner with similar folding circuits, which are denoted by reference signs beginning with FC, and with similar interpolating folding circuits, which are denoted by reference signs beginning with IFC. The folding circuits FC ... carry out a part of the folding operation F1. The interpolating folding circuits IFC ... carry out the first interpolation operation I1 and subsequently carry out the other part of the folding operation F1. The resistor string RSTR carries out the second interpolation operation I2.

Figure 4B:
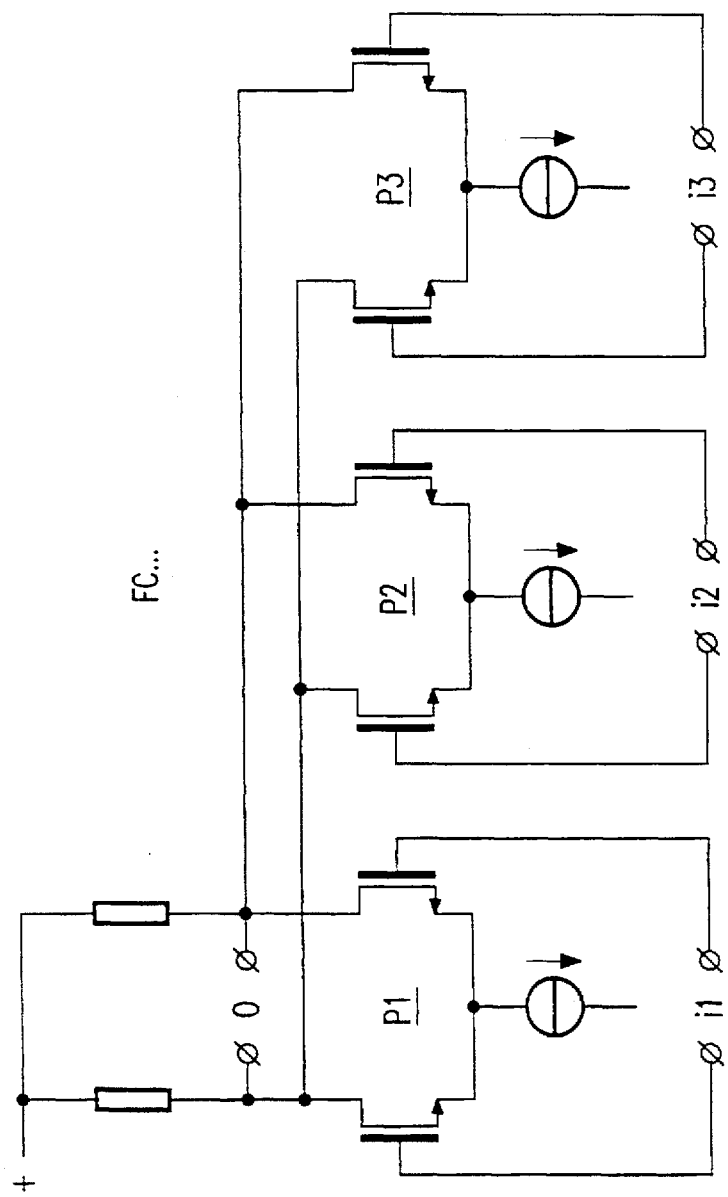
FIG. 4b shows, in a circuit diagram form, an implementation example of a folding circuit in the FIG. 4a intermediate part.

FIG. 4b shows details of an arbitrary folding circuit. The FIG. 4b folding circuit essentially comprises three differential pairs P1, P2 and P3 whose main current output terminals are interconnected so as to carry out a folding operation by a factor of three. Three differential input signals may be applied, respectively, to the differential pairs P1, P2 and P3 via differential inputs i1, i2 and i3. In response, a differential output signal is provided at output O.

Figure 4C:
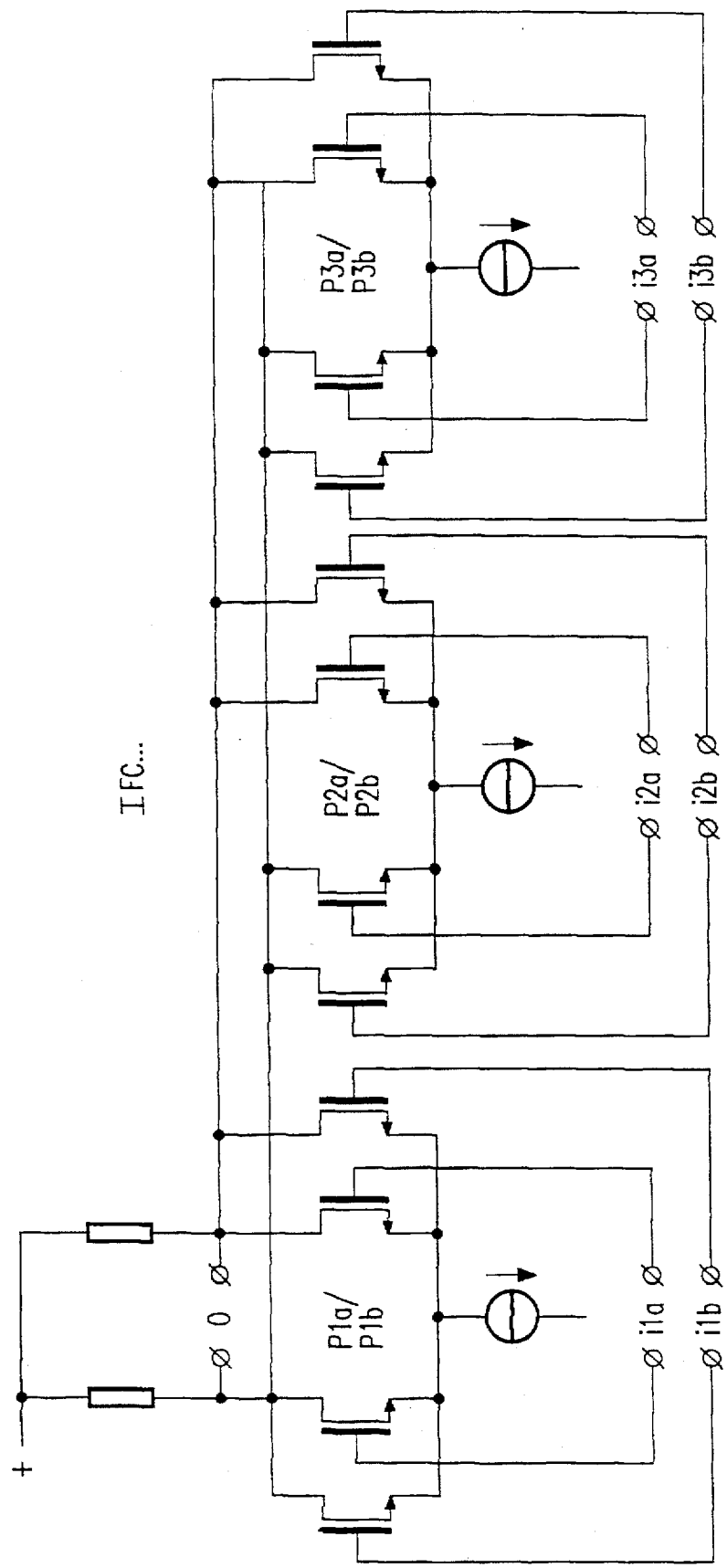
FIG. 4c shows, in a circuit diagram form, an implementation example of an interpolating folding circuit in the FIG. 4a intermediate part.

FIG. 4c shows details of an arbitrary interpolating folding circuit. The FIG. 4c interpolating folding circuit essentially comprises three couples of parallel differential pairs P1a/P1b, P2a/P2b, P3a/P3b. Each couple of parallel differential pairs carries out an interpolation between a pair of differential signals supplied thereto. Hence, the interpolation factor is two. The main current output terminals of the three couples of parallel differential pairs P1a/P1b, P2a/P2b, P3a/P3b are interconnected so as to carry out a folding operation on the three interpolated signals provided by the three pairs of differential pairs. Hence, the folding factor is three. Three pairs of differential input signals may be applied, respectively, to the couples of differential pairs P1a/P1b, P2a/P2b, P3a/P3b via pairs of differential inputs i1a/i1b, i2a/i2b and i3a/i3b. In response, a differential output signal is provided at output O.

Figure 4D:
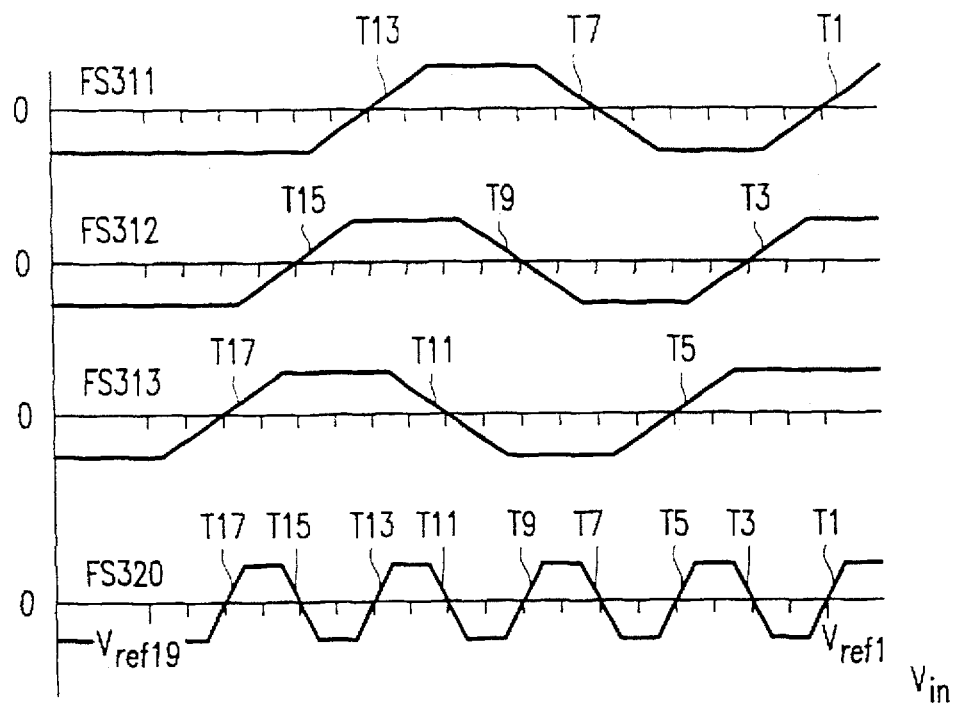
FIGS. 4d and 4e show folding signals in the FIG. 4a intermediate part.

The FIG. 4a intermediate part IMS operates as follows. The folding circuit FC111 combines three transitions T2, T8 and T14 to provide a folding signal FS111. Likewise, the folding circuit FC112 combines three transitions T4, T10 and T16 to provide a folding signal FS112, and folding circuit FC113 combines transitions T6, T12 and T18 to provide a folding signal FS113. The folding circuit FC120 combines the three folding signals FS111, FS112 and FS113 to a folding signal FS120 which is applied to the resistor string RSTR. The combination of folding circuits FC311, FC312, FC313 and FC320 operates in the same manner as the combination of folding circuits FC111, FC112, FC113 and FC120 described above, but processes other signals which can readily be understood from FIG. 4a. FIG. 4d shows folding signals FS311, FS312, FS313 and FS320 in the first-mentioned combination. The folding signal FS311 comprises transitions T1, T7 and T13, the folding signal FS312 comprises transitions T3, T9 and T15, and the folding signal FS313 comprises transitions T5, T11 and T17. The folding signal FS320 comprises all these odd transitions.

Figure 4E:
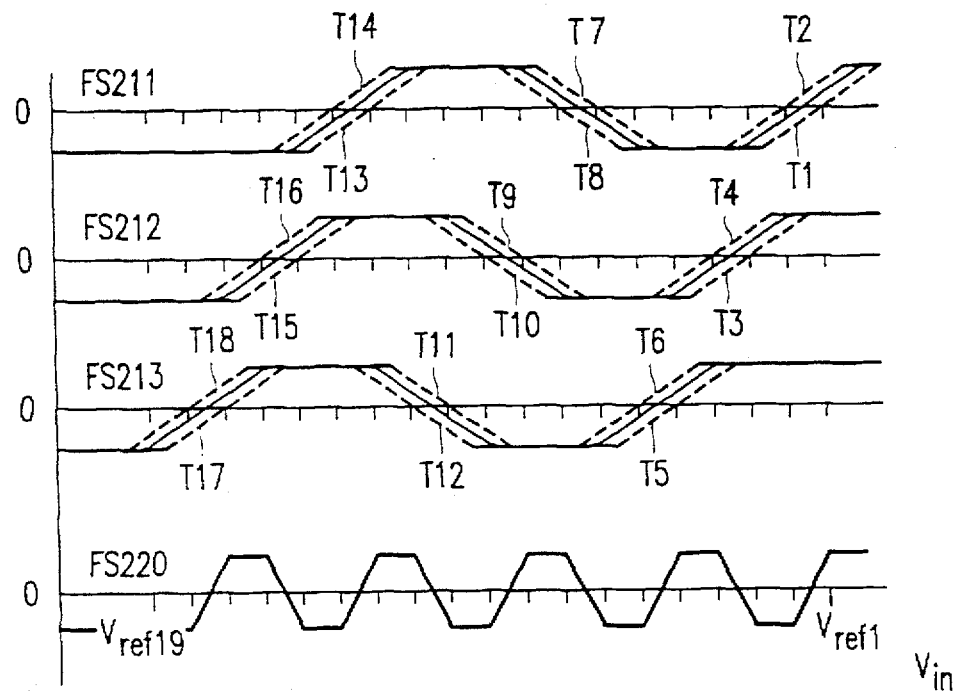

The interpolating folding circuit IFC211 interpolates between the transitions T1/T2, T7/T8 and T13/T14, and combines the interpolated transitions to provide a folding signal FS211. Likewise, the interpolating folding circuit IFC212 interpolates between the transitions T3/T4, T9/T10 and T15/T16, and combines the interpolated transitions to provide a folding signal FS212, and interpolating folding circuit IFC213 interpolates between the transitions T5/T6, T11/T12 and T17/T18, and combines the interpolated transitions to provide a folding signal FS213. FIG. 4e illustrates folding signals FS211, FS212, FS213 and FS220. In FIG. 4e, interpolated transitions which are comprised in these folding signals, are shown in solid lines. The transitions provided by the input part IS, from which the interpolated transitions are derived, are shown in broken lines. The folding circuit FC220 combines the three folding signals FS211, FS212 and FS213 to a folding signal FS220 which is applied to the resistor string RSTR. The folding signal FS220 is also shown in FIG. 4e. The combination of interpolating folding circuits IFC411, IFC412, IFC413 and folding circuit FC420 operates in the same manner as the combination of interpolating folding circuits IFC211, IFC212, IFC213 and folding circuit FC220 described above, but processes other signals which can readily be understood from FIG. 4a.

The resistor string RSTR, of which only one half is shown in FIG. 4a, is arranged to operate in a differential manner. This is done because the folding signals FS120, FS220, FS320 and FS420, on which the second interpolation operation I2 is carried out, are differential signals. The resistor string RSTR comprises 64 consecutive nodes N0 ... N63 between which resistances are coupled. One half of the folding signal FS120 is applied to node N0 of the resistor string RSTR, whereas the other, complementary half is applied to node N32. Likewise, one half of the folding signal FS220 is applied to node N8, whereas the other, complementary half is applied to node N40, not shown in FIG. 4a, and so forth. Accordingly, the resistor string provides differential 32 bit-determining signals X0 ... X31 of which one half X0+ ... X31+ is provided by the half of the resistor string shown in FIG. 4a, whereas the other, complementary half X0− ... X31− is provided by the half of the resistor string, not shown in FIG. 4a.

It should be noted that the first interpolation I1 in the FIG. 4a intermediate stage is carried out by active components, where as the second interpolation is carried out by passive components. In principle, the first interpolation I1 could also have been carried out by passive components, similarly to the second interpolation I2. In that case, the interpolating folding circuits IFC ... could have been replaced by folding circuits FC .... However, if the first interpolation had been carried out by passive component, the gain of the input, amplifiers A1 ... A19 would have been affected, which would have resulted in a loss of accuracy.

Figure 5:
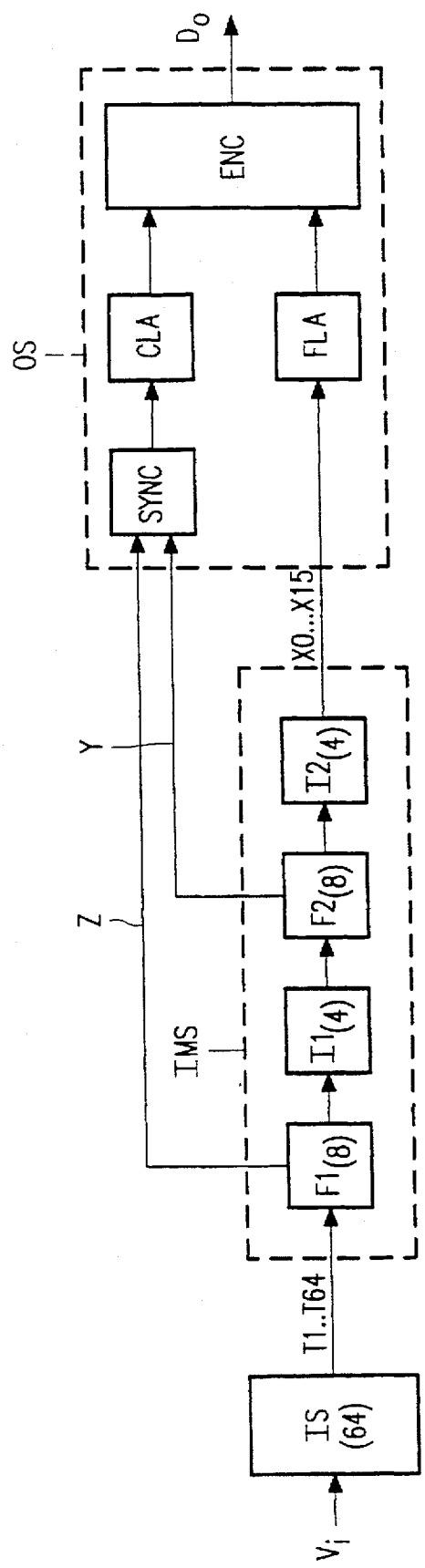
FIG. 5 shows a second specific example of an A/D converter in accordance with the invention.

FIG. 5 shows a second specific example of a 10-bit A/D converter in accordance with the invention. The input part IS of the FIG. 5 A/D converter provides 64 transitions T1 ... T64 in response to the analog input signal Vi. The intermediate part IMS of the FIG. 5 A/D converter consecutively carries out a first folding operation F1 by a factor of 8, a first interpolation operation I1 by a factor of 4, a second folding operation F2 by a factor of 8, and a second interpolation by a factor of 4. Accordingly, 16 bit-determining signals X0 ... X15 are obtained from which the output part OS derives 4 least significant bits for the 10-bit digital output signal Do. In addition, the output part OS derives 3 most significant bits from coarse bit-determining signals Z, and 3 middle significant bits from middle bit-determining signals Y. The coarse bit-determining signals Z may be obtained in a manner similar to that in the above cited U.S. Pat. No. 4,831,379. The manner in which middle bit-determining signals Y are obtained will be discussed hereinafter with reference to FIG. 6b.

FIG. 5 also shows some details of the output part OS of the A/D converter. The middle and coarse bit-determining signals Y and Z are applied to a coarse latch arrangement CLA via a synchronisation circuit SYNC. The synchronisation circuit synchronizes the middle and coarse bit-determining signals Y and Z, respectively, with the bit-determining signals X0 ... X15. The bit-determining signals X0 ... X15 are applied to a fine latch arrangement FLA. The fine latch arrangement FLA comprises a latch for each bit-determining signal X0 ... X15 supplied thereto. Likewise, the coarse latch arrangements CLA comprise a latch for each individual middle and coarse bit-determining signal supplied thereto. An encoding part ENC encodes the output bits provided by the latches in both latch arrangements CLA and FLA, into the 10-bit digital output signal Do.

The input part IS and the circuitry for carrying out the first folding operation F1 and the first interpolation operation I2 may be implemented, for example, in a manner known from the aforesaid U.S. Pat. No. 4,831,379. Accordingly, 32 differential folding signals FS1 ... FS32 will be obtained, which are comparable with the complementary signal pairs VD0/VDN0 ... VD31/VDN31, respectively, in said U.S. Pat. No. 4,831,379.

Figure 6A:
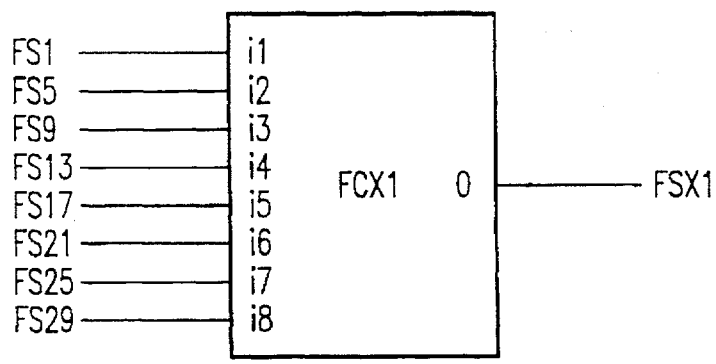
FIG. 6a shows, in a block diagram form, an implementation example of a folding stage in the FIG. 5 A/D converter.
Figure 6A:
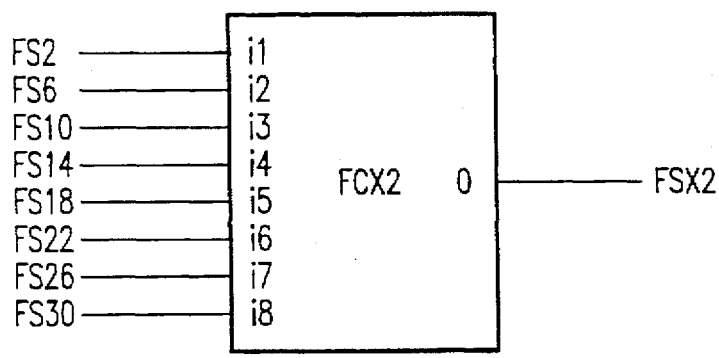
Figure 6A:
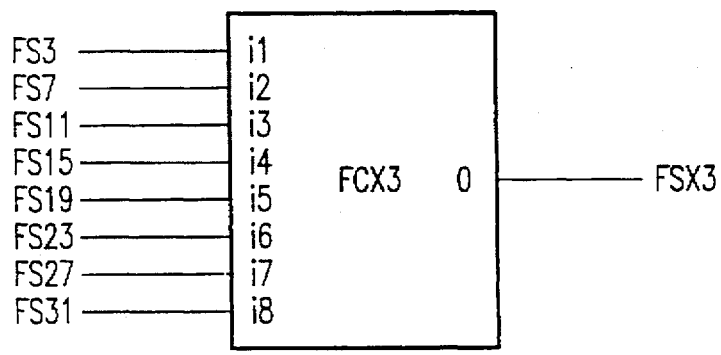
Figure 6A:
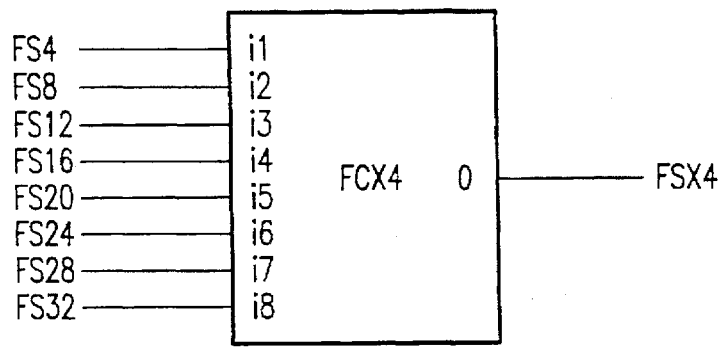

FIG. 6a shows an implementation example of a folding stage which is particularly suited to carry out the second folding operation F2. The FIG. 6a folding stage comprises four similar folding circuits FCX1, FCX2, FCX3 and FCX4. The folding circuit FCX1 combines the folding signals FS1, FS5, FS9, FS13, FS17, FS21, FS25 and FS29, which are applied to inputs i1 ... i8, respectively, to provide a folding signal FX1. The folding circuit FCX2 combines the folding signals FS2, FS6, FS10, FS14, FS18, FS22, FS26 and FS30, which are applied to inputs i1 ... i8 respectively, to provide a folding signal FSX2, and so on.

Figure 6B:
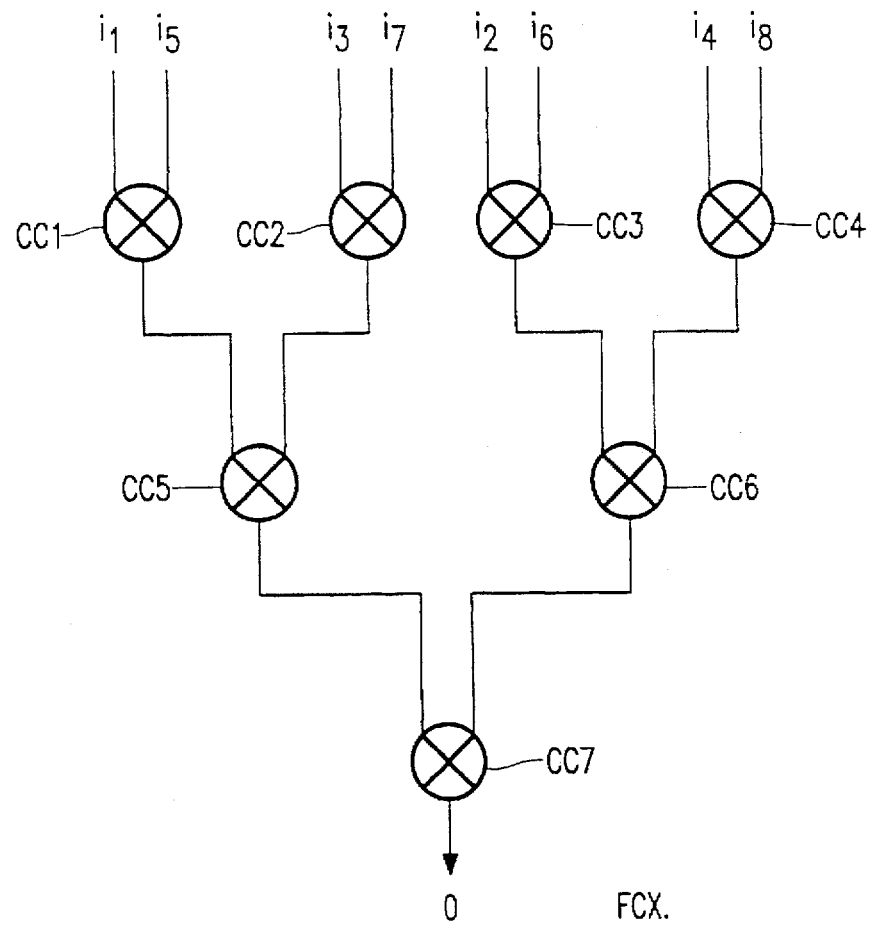
FIG. 6b shows, in a block diagram form, an implementation example of a folding circuit in the FIG. 6a folding stage.

FIG. 6b shows details of an arbitrary folding circuit FCX, in the FIG. 6a folding stage. The FIG. 6b folding circuit comprises 7 combining circuits CC1 ... CC7 which effectively operate as analog exclusive ORs and may be implemented, for example, with multipliers. The combining circuit CC1 combines folding signals applied at inputs i1 and i5, the combining circuit CC2 combines folding signals applied at inputs i3 and i7, the combining circuit CC3 combines folding signals applied at inputs i2 and i6, the combining circuit CC2 combines folding signals applied at inputs i4 and i8, and so on. The combining circuit CC5 combines Output signals of combining circuits CC1 and CC2, and combining circuit CC6 combines output signals of combining circuits CC3 and CC4. Finally, combining circuit CC7 combines output signals of combining circuits CC5 and CC6 to provide an output folding signal at output 0.

Figure 6C:
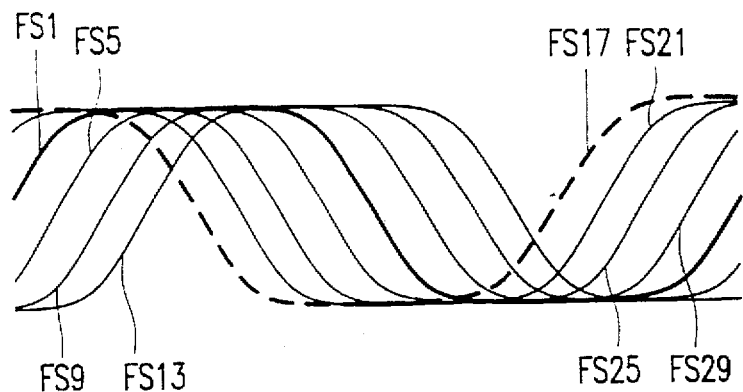
FIGS. 6c to 6d show signals in the FIG. 6b folding circuit.
Figure 6D:
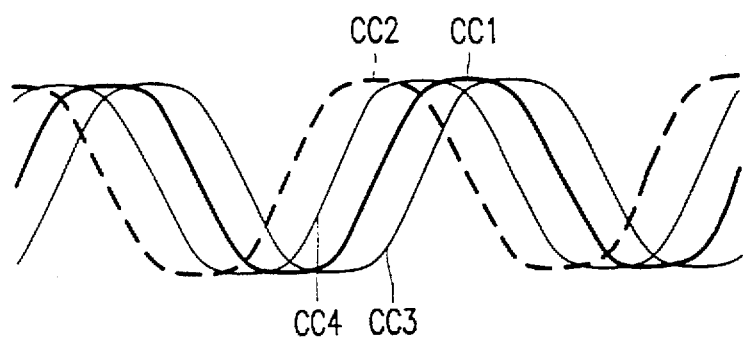
Figure 6E:
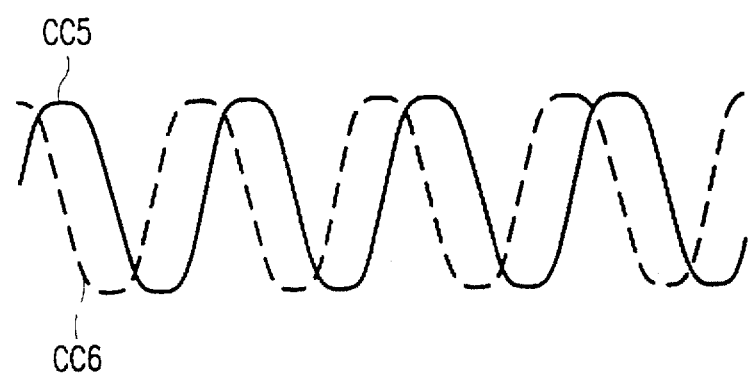
Figure 6F:
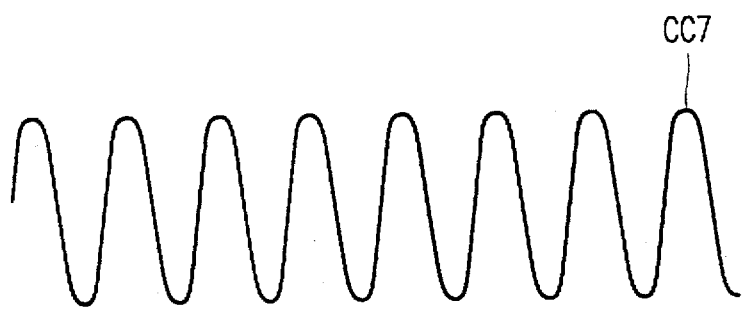

FIGS. 6c to 6f illustrate the operation of folding circuit FCX1. FIG. 6c shows the folding signals FS1, FS5, FS9, FS13, FS17, FS21, FS25 and FS29 applied to folding circuit FCX1. The folding signals FS1 and FS17, which are combined in combining circuit CC1 are shown in a fat solid line and a fat broken line, respectively, while the other folding signals are shown in thin solid lines. FIG. 6d shows the output signals of combining circuits CC1, CC2, CC3 and CC4 in folding circuit FSX1. The output signals of combining circuits CC1 and CC2 are shown with a thick line and a thick dashed line, respectively, while the other signals are shown with thin lines. FIG. 6e shows the output signals of combining circuits CC5 and CC6 in folding circuit FCX1, and FIG. 6f shows the signal at output 0 of folding circuit FCX1 which is the folding signal FSX1. In FIGS. 6d and 6e, an output signal of a combining circuit is denoted by the same reference signs used for that combining circuit.

The FIG. 6b folding circuit is particularly suited to provide the previously mentioned middle bit-determining signals. In principle, an output signal from any one of combining circuits CC1 ... CC4 in any one of the folding circuits FCX1 ... FCX4 may be applied to the output part as a middle bit-determining signal. Furthermore, an output signal from any one of combining circuits CC4 or CC6 in any one of the folding circuits FCX1 ... FCX4 may be applied to the output part OS as a further middle bit-determining signal. The latter middle bit-determining signal is one rank less significant than the first-mentioned bit-determining signal. Furthermore, the output signal of combining circuit CC7 in any one of the folding circuits FCX11 ... FCX4 may also be applied as yet another middle bit-determining signals to the output part OS. The latter middle bit-determining signal is two ranks less significant than the first-mentioned bit-determining signal provided by the folding circuit.

It should be noted that the above-mentioned examples illustrate rather than limit the invention, and that those skilled in the art will be able to design may alternative embodiments without departing from the scope of the appended claims. Any reference signs between parentheses shall not be construed as limiting the claim concerned. The invention can be implemented by means of hardware comprising several distinct elements, and by means of a suitably programmed computer.

We claim:

1. An A/D conversion circuit comprising:
    an input part (IS) for providing differential transitions associated with different levels of an analog input signal;
    an intermediate part (IMS) for carrying out at least one folding operation and at least one interpolation operation on the transitions to obtain a set of bit-determining signals; and
    an output part (OS) for deriving a digital output signal (Do) from the bit-determining signals;
    wherein the intermediate part (IMS) is arranged to carry out at least one of said folding and interpolation operations more than once in alternation with the other of said operations.

2. An A/D conversion circuit as claimed in claim 1, wherein the intermediate part (IMS) comprises an alternating sequence of folding stages and interpolation stages (F1,I1,F2,I2).

3. An A/D conversion circuit as claimed in claim 2, wherein at least one folding stage (F2) is formed by one or more multipliers (CC1 ... CC7).

4. An A/D conversion circuit as claimed in claim 2, wherein the output part (OS) comprises a coarse latch (CLA) for deriving a bit for the digital output signal (Do) from an internal signal provided by a folding stage (F2) which is coupled between a pair of intermediate stages ($I_1,I_2$) in the intermediate part (IMS).

5. A method of A/D conversion, comprising the steps of:
    generating differential transitions associated with different levels of an analog input signal (Vi);

carrying out at least one folding operation and at least one interpolation operation on the transitions to obtain a set of bit-determining signals;

deriving a digital output signal from the bit-determining signals; and carrying out at least one of said folding and interpolation operations more than once in alternation with the other of said operations.

6. A digital signal processor (SPR) comprising a digital signal-processing circuit (DSP) coupled to an A/D conversion circuit (ADC) as claimed in claim 1, which A/D conversion circuit is adapted to convert an analog input signal (Sia) into a digital signal for processing by the digital signal-processing circuit (DSP).

* * * * *